United States Patent
Motoyama et al.

(10) Patent No.: US 10,658,233 B2
(45) Date of Patent: May 19, 2020

(54) DIELECTRIC DAMAGE-FREE DUAL DAMASCENE CU INTERCONNECTS WITHOUT BARRIER AT VIA BOTTOM

(71) Applicant: International Business Machines Corporation, Armonk, NY (US)

(72) Inventors: Koichi Motoyama, Clifton Park, NY (US); Benjamin D. Briggs, Waterford, NY (US); Gangadhara Raja Muthinti, Albany, NY (US); Cornelius Brown Peethala, Slingerlands, NY (US); Lawrence A. Clevenger, Saratoga Springs, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/163,256

(22) Filed: Oct. 17, 2018

(65) Prior Publication Data

US 2020/0126854 A1 Apr. 23, 2020

(51) Int. Cl.
*H01L 21/768* (2006.01)
*H01L 23/522* (2006.01)
*H01L 23/532* (2006.01)

(52) U.S. Cl.
CPC .. *H01L 21/76844* (2013.01); *H01L 21/76802* (2013.01); *H01L 21/76862* (2013.01); *H01L 21/76877* (2013.01); *H01L 23/5226* (2013.01); *H01L 23/53238* (2013.01)

(58) Field of Classification Search
CPC ......... H01L 21/76844; H01L 21/76877; H01L 23/5226

USPC .......................................... 438/687; 257/751
See application file for complete search history.

(56) References Cited

U.S. PATENT DOCUMENTS

| | | | |
|---|---|---|---|
| 6,395,627 B1 * | 5/2002 | Hoshino | H01L 21/288 257/758 |
| 6,492,270 B1 | 12/2002 | Lou | |
| 6,921,722 B2 | 7/2005 | Ogure et al. | |
| 6,987,059 B1 | 1/2006 | Burke et al. | |
| (Continued) | | | |

OTHER PUBLICATIONS

Frank E. Stone, "Chapter 13 Electroless Copper in Printed Wiring Board Fabrication," accessed online Aug. 14, 2018 (45 pages).
(Continued)

*Primary Examiner* — David Vu
*Assistant Examiner* — Brandon C Fox
(74) *Attorney, Agent, or Firm* — Vazken Alexanian; Michael J. Chang, LLC (57) ABSTRACT

Techniques for dielectric damage-free interconnects are provided. In one aspect, a method for forming a Cu interconnect structure includes: forming a via and trench in a dielectric over a metal line M1; depositing a first barrier layer into the via and trench; removing the first barrier layer from the via and trench bottoms using neutral beam oxidation, and removing oxidized portions of the first barrier layer such that the first barrier layer remains along only sidewalls of the via and trench; depositing Cu into the via in direct contact with the metal line M1 to form a via V1; lining the trench with a second barrier layer; and depositing Cu into the trench to form a metal line M2. The second barrier layer can instead include Mn or optionally CuMn so as to further serve as a seed layer. A Cu interconnect structure is also provided.

7 Claims, 8 Drawing Sheets

(56) References Cited

U.S. PATENT DOCUMENTS

| | | | |
|---|---|---|---|
| 7,071,095 | B2 | 7/2006 | Huang et al. |
| 7,422,983 | B2 | 9/2008 | Cotte et al. |
| 8,847,148 | B2 | 9/2014 | Kirpatrick et al. |
| 9,449,874 | B1 | 9/2016 | Standaert et al. |
| 9,984,923 | B2 | 5/2018 | Briggs et al. |
| 2007/0013069 | A1* | 1/2007 | Tada ............ H01L 21/76802 257/758 |
| 2017/0194247 | A1* | 7/2017 | Chang ........... H01L 21/76807 |
| 2018/0090418 | A1 | 3/2018 | Bonilla et al. |

OTHER PUBLICATIONS

Ohno et al., "Neutral Beam Oxidation for Oxide-based Nanodevice," Proceedings of the 16th International Conference on Nanotechnology, pp. 171-173 (Aug. 2016).

A. Agulyansky, "Potassium fluorotantalate in solid, dissolved and molten conditions," J. Fluorine Chemistry 123, Oct. 2003, pp. 155-161.

J. Koike et al., "Self-Formed Barrier with Cu—Mn alloy Metallization and its Effects on Reliability." AIP Conference Proceedings, vol. 817, No. 1, Feb. 2006, pp. 43-51. (Abstract).

Takamasa Usui et al., "Highly reliable copper dual-damascene interconnects with self-formed MnSixOy barrier layer," IEEE Transactions on Electron Devices, vol. 53, No. 10, Oct. 2006, pp. 2492-2499.

* cited by examiner

DIELECTRIC DAMAGE-FREE DUAL DAMASCENE CU INTERCONNECTS WITHOUT BARRIER AT VIA BOTTOM

FIELD OF THE INVENTION

The present invention relates to interconnect technology, and more particularly, to techniques for dielectric damage-free dual damascene interconnects without a barrier layer present at via bottom.

BACKGROUND OF THE INVENTION

Back end of line (BEOL) interconnects are typically created using a dual damascene process that involves patterning trenches and vias in a dielectric and then filling these features with a conductor such as copper (Cu). A barrier layer (e.g., tantalum nitride (TaN)) is often employed lining the trenches/vias to prevent Cu diffusion into the dielectric.

However, having a via structure without TaN at the via bottom (or with large contact area at the via bottom) is desirable to reduce via resistance and improve electromigration (EM) performance. However, a barrier etch-back (gouging) process (using for example argon (Ar+) etching in physical vapor deposition (PVD) chamber) causes severe low-κ damage at the trench bottom which leads to an increase in capacitance and reliability degradation.

Alternatively, a conventional wet etching (gouging) process can be employed to increase contact area at the via bottom. However, due to the isotropic nature of a wet etching process, under-cut (lateral etching) of the dielectric occurs, resulting in under-cut areas that are difficult to fill by Cu plating since a seed layer cannot be deposited around under-cut area.

Thus, improved techniques for forming Cu interconnects without a barrier layer at the via bottom would be desirable.

SUMMARY OF THE INVENTION

The present invention provides techniques for dielectric damage-free dual damascene interconnects without a barrier layer present at via bottom. In one aspect of the invention, a method for forming a copper (Cu) interconnect structure is provided. The method includes: forming a via and a trench in a dielectric over a metal line M1; depositing a first barrier layer into, and lining, the via and the trench; removing the first barrier layer from a bottom of the via and a bottom of the trench by selectively oxidizing portions of the first barrier layer along the bottom of the via and the bottom of the trench using neutral beam oxidation that does not damage the dielectric, and removing the portions of the first barrier layer that have been oxidized including at the bottom of the via such that the first barrier layer remains along only sidewalls of the via and the trench; depositing Cu into the via in direct contact with the metal line M1 to form a via V1; at least partially removing the first barrier layer that remains along the sidewalls of the trench; lining the trench with a second barrier layer that covers a top of the via V1; and depositing Cu into the trench over the second barrier layer to form a metal line M2.

In another aspect of the invention, another method for forming a Cu interconnect structure is provided. The method includes: forming a via and a trench in a dielectric over a metal line M1; depositing a first barrier layer into, and lining, the via and the trench; removing the first barrier layer from a bottom of the via and a bottom of the trench by selectively oxidizing portions of the barrier layer along the bottom of the via and the bottom of the trench using neutral beam oxidation that does not damage the dielectric, and removing the portions of the first barrier layer that have been oxidized including at the bottom of the via such that the first barrier layer remains along only sidewalls of the via and the trench; depositing a liner including manganese (Mn) into the via and the trench over the first barrier layer that remains along sidewalls of the via and the trench, wherein the liner is disposed directly on the dielectric at the bottom of the trench; annealing the liner to react the Mn in the liner with the dielectric to form a second barrier layer including manganese silicate ($MnSi_xO_y$) at the bottom of the trench; removing unreacted portions of the liner including the unreacted portions of the liner at the bottom of the via; and depositing Cu into the via and the trench over the second barrier layer to form i) a via V1 in the via that is in direct contact with the metal line M1 and ii) a metal line M2 in the trench.

In yet another aspect of the invention, yet another method for forming a Cu interconnect structure is provided. The method includes: forming a via and a trench in a dielectric over a metal line M1; depositing a first barrier layer into, and lining, the via and the trench; removing the first barrier layer from a bottom of the via and a bottom of the trench by selectively oxidizing portions of the barrier layer along the bottom of the via and the bottom of the trench using neutral beam oxidation that does not damage the dielectric, and removing the portions of the first barrier layer that have been oxidized including at the bottom of the via such that the first barrier layer remains along only sidewalls of the via and the trench; depositing a liner including CuMn into the via and the trench over the first barrier layer that remains along sidewalls of the via and the trench, wherein the liner is disposed directly on the dielectric at the bottom of the trench, and wherein the liner serves as a seed layer; depositing Cu into the via and the trench over the liner to form i) a via V1 in the via that is in direct contact with the metal line M1 and ii) a metal line M2 in the trench; and annealing the liner and the Cu to react the Mn in the liner with the dielectric to form a second barrier layer including $MnSi_xO_y$ at the bottom of the trench.

In still yet another aspect of the invention, a Cu interconnect structure is provided. The Cu interconnect structure includes: a via and a trench formed in a dielectric over a metal line M1; a first barrier layer disposed along sidewalls of the via; a second dielectric layer disposed along a bottom of the trench; and Cu disposed i) in the via forming a via V1 and ii) in the trench forming a metal line M2, wherein the Cu disposed in the via is in direct contact with the metal line M1.

A more complete understanding of the present invention, as well as further features and advantages of the present invention, will be obtained by reference to the following detailed description and drawings.

DETAILED DESCRIPTION OF PREFERRED EMBODIMENTS

Provided herein are techniques for dielectric damage-free dual damascene interconnects without a barrier layer present at the via bottom which advantageously leads to lower via resistance and high copper (Cu) fill quality. See, for example, FIG. 1 which is a cross-sectional diagram illustrating some of the advantageous features of the present techniques.

Figure 1:
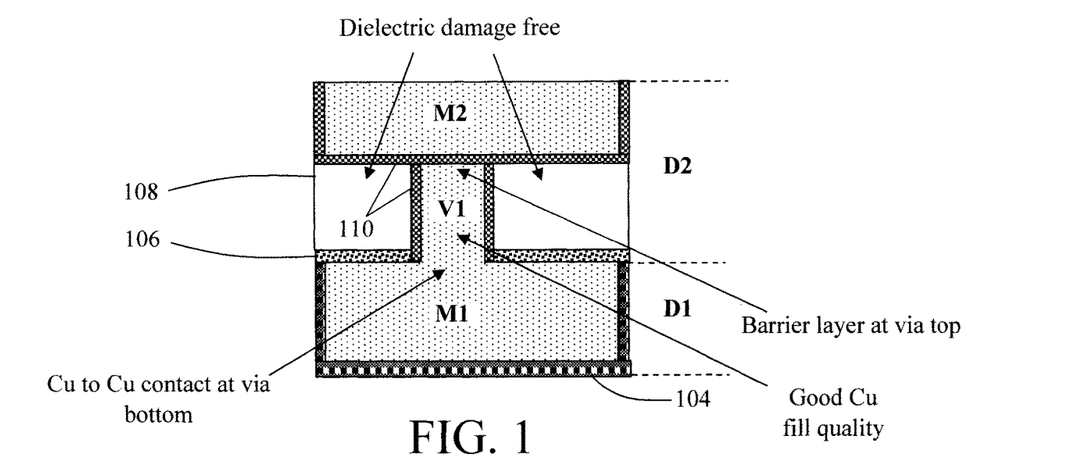
FIG. 1 is a cross-sectional diagram illustrating a Cu interconnect structure according to an embodiment of the present invention.

As shown in FIG. 1, the present dual damascene interconnect structure includes a metal line and via (i.e., metal line M2 and via V1, respectively, in this example) formed on a first metal line M1. The metal line M1 and via V1/metal line M2 are present in dielectric layers D1 and D2, respectively.

Namely, as shown in FIG. 1, metal line M1 is present in dielectric D1. Metal line M1 (e.g., Cu) is separated from the dielectric D1 by a barrier layer 104. The interconnect, i.e., via V1 and metal line M2 are present in dielectric D2. According to an exemplary embodiment, dielectric D2 includes a capping layer 106 and an interlayer dielectric (ILD) 108. The term "barrier layer" as used herein refers to a layer (or layers) that prevents diffusion of Cu into the surrounding dielectric.

A barrier layer 110 is present lining the metal line M2 and sidewalls of the via V1, however the barrier layer 110 is absent at the bottom of the via V1. As noted in FIG. 1, the absence of the barrier layer 110 at the bottom of the via V1 enables direct Cu-to-Cu contact (between the via V1 and the metal line M1) which provides low via resistance (as compared to conventional processes having a barrier layer in between the via bottom and the underlying metal line).

As will be described in detail below, the present techniques employ neutral beam oxidation to remove the barrier layer from the bottom of the via. Neutral beam oxidation advantageously avoids the severe dielectric damage resulting from conventional etch-back processes like argon etching and the lateral etching (undercutting) that occurs with conventional wet etching processes. As highlighted above, dielectric damage undesirably leads to an increase in capacitance and reliability degradation, while undercutting at the bottom of the via makes it difficult to get a good quality Cu fill and oftentimes leads to void formation. These drawbacks are avoided altogether with the present techniques.

As shown in FIG. 1, embodiments are provided herein where the barrier layer, while absent from the bottom of the via V1, is present at the top of the via V1. This configuration exhibits blocking boundary effects due to having the barrier layer at the top of the via V1 which prevents Cu migration and guarantees short length effects.

Figure 2:
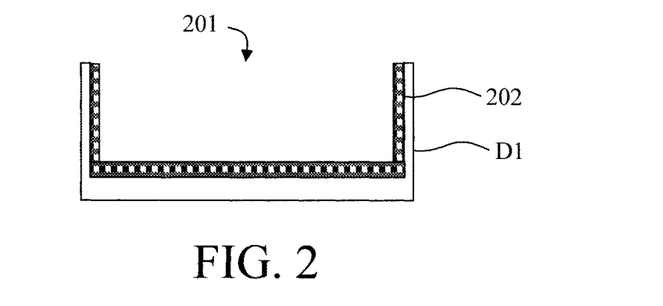
FIG. 2 is a cross-sectional diagram illustrating a trench having been patterned in a dielectric D1, and a conformal barrier layer having been deposited into/lining the trench according to an embodiment of the present invention.

A first exemplary methodology for forming a Cu interconnect structure in accordance with the present techniques is now described by way of reference to FIGS. 2-11. As shown in FIG. 2, a trench 201 is patterned in the dielectric D1. Generally, dielectric D1 is any suitable ILD including but not limited to low-κ dielectrics such as silicon oxide (SiO$_2$) and/or ultralow-κ (ULK) dielectrics (ULK-ILD), e.g., having a dielectric constant κ of less than 2.7. By comparison, silicon dioxide (SiO$_2$) has a dielectric constant κ value of 3.9. Suitable ultralow-κ dielectric materials include, but are not limited to, porous organosilicate glass (pSiCOH). Standard lithography and etching techniques can be employed to pattern trench 201 in the dielectric D1.

A conformal barrier layer 202 is then deposited into/lining the trench 201. Suitable materials for the barrier layer 202 include, but are not limited to, tantalum nitride (TaN), titanium nitride (TiN), tungsten nitride (WN), tantalum (Ta) and/or titanium (Ti). A conformal deposition process such as chemical vapor deposition (CVD), atomic layer deposition (ALD) or physical vapor deposition (PVD) can be employed to deposit the barrier layer 102. According to an exemplary embodiment, barrier layer 202 has a thickness of from about 2 nanometers (nm) to about 10 nm and ranges therebetween.

Figure 3:
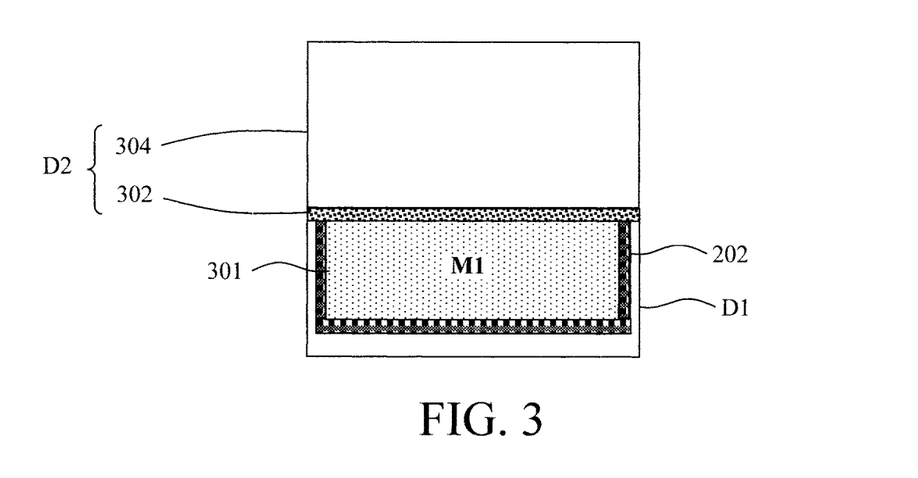
FIG. 3 is a cross-sectional diagram illustrating a conductor having been deposited into (and filling) the trench over the barrier layer forming a metal line M1, and a dielectric D2 having been deposited onto the dielectric D1/metal line M1 according to an embodiment of the present invention.

Next, as shown in FIG. 3, a conductor 301 is then deposited into (and filling) the trench 201 over the barrier layer 202, forming metal line M1. According to an exemplary embodiment, the conductor 301 is Cu which is deposited using an electroless plating process. See, for example, Frank E. Stone, "Chapter 13 Electroless Copper In Printed Wiring Board Fabrication," accessed Aug. 14, 2018 (45 pages), the contents of which are incorporated by reference as if fully set forth herein. The primary difference between electroless plating and electroplating is that electroless plating does not require external electrical power. However, embodiments are also contemplated herein where standard electroplating or any other suitable deposition technique or combinations of techniques are employed.

By way of example only, a Cu-containing seed layer (not shown) is first deposited into/lining the trench 201. Cu (i.e., conductor 301) is then plated onto the seed layer. As shown in FIG. 3, a process such as chemical-mechanical polishing (CMP) is then used to remove the Cu overburden and provide a planar surface onto which the interconnect is built.

Dielectric D2 is then deposited onto the dielectric D1/metal line M1. The dielectric D2 is also referred to herein as an underlayer (UL) since it is the underlying layer in which the interconnect will be formed. According to an exemplary embodiment, dielectric D2 is formed from a stack of layers including, for example, a capping layer 302 disposed on the dielectric D1/metal line M1 and an ILD 304 disposed on the capping layer 302.

Suitable materials for the capping layer 302 include, but are not limited to, dielectrics such as silicon carbon nitride (SiCN), hydrogen silicon carbon nitride (SiCNH) and/or aluminum nitride (AlN). As provided above, suitable ILDs include, but are not limited to, low-κ dielectrics such as $SiO_2$ and/or ultralow-κ dielectrics such as pSiCOH.

Figure 4:
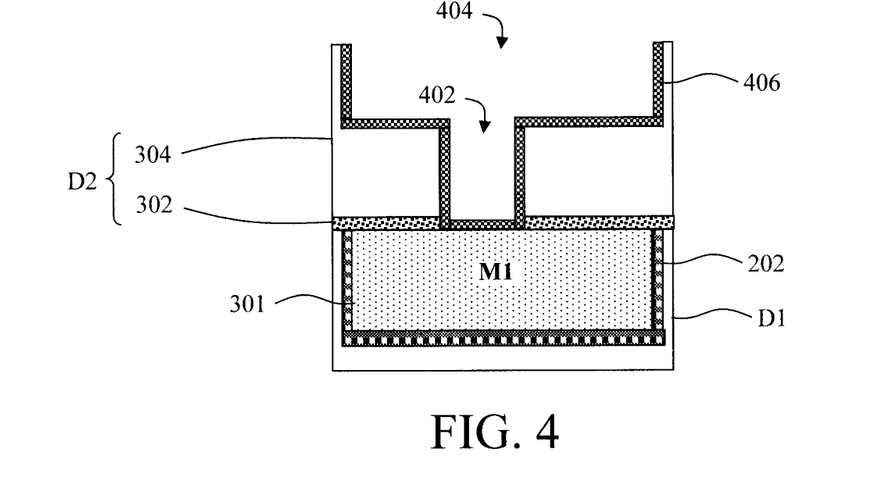
FIG. 4 is a cross-sectional diagram illustrating a via and a trench having been patterned in the dielectric D1, and a (first) barrier layer having been deposited into/lining the via and trench according to an embodiment of the present invention.

Standard lithography and etching techniques are then used to pattern a via 402 and a trench 404 in the dielectric D1. See FIG. 4. As shown in FIG. 4, the via 402 extends through the capping layer 302, down to the metal line M1. A conformal barrier layer 406 is then deposited into/lining the via 402 and trench 404. As provided above, suitable barrier layer materials include, but are not limited to, TaN, TiN, WN, Ta and/or Ti. A conformal deposition process such as CVD, ALD or PVD can be employed to deposit the barrier layer 406. According to an exemplary embodiment, barrier layer 406 has a thickness of from about 2 nm to about 10 nm and ranges therebetween.

Figure 5:
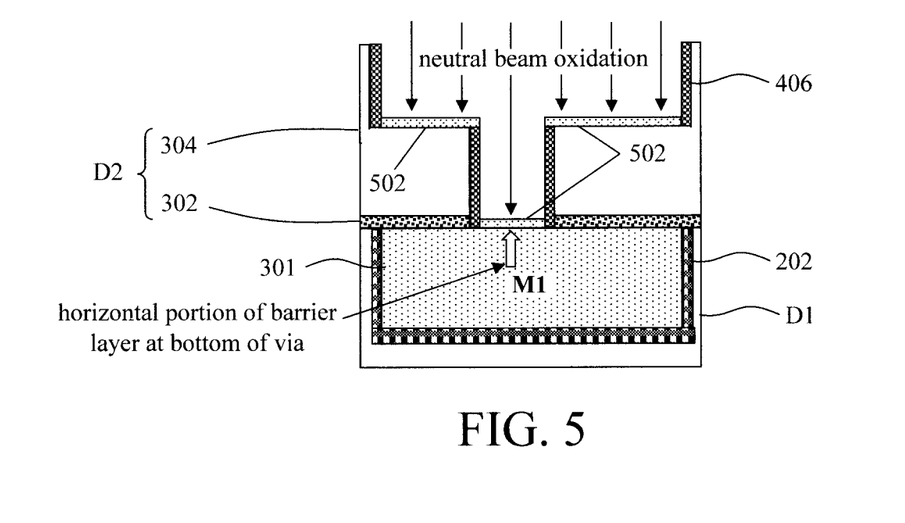
FIG. 5 is a cross-sectional diagram illustrating neutral beam oxidation having been used to selectively oxidize horizontal portions of the first barrier layer forming oxidized portions of the barrier layer along these horizontal surfaces according to an embodiment of the present invention.

While barrier layer 406, as deposited, is present at the bottom of the via V1, this portion of barrier layer 406 will next be removed via neutral beam oxidation. Namely, as shown in FIG. 5, neutral beam oxidation is employed to selectively oxidize the horizontal portions of the barrier layer 406 in via 402 and trench 404, including the (horizontal) portion of barrier layer 406 at the bottom of the via 402. The result is the formation of oxidized portions 502 of the barrier layer 406 along these horizontal surfaces. See FIG. 5. By way of example only, when the barrier layer 406 is formed from TaN, this neutral beam process will oxidize the horizontal portions 502 thereof into tantalum oxynitride (TaOxNy).

For a description of neutral beam oxidation of metal films such as Ta-containing films, see Ohno et al., "Neutral Beam Oxidation for Oxide-based Nanodevice," Proceedings of the 16th International Conference on Nanotechnology, pgs. 171-173 (August 2016), the contents of which are incorporated by reference as if fully set forth herein. During this process, the barrier layer is irradiated with a neutral oxygen beam to convert the barrier layer to a metal oxide, which can then be selectively removed. See, for example, U.S. Pat. No. 8,847,148 issued to Kirpatrick et al., entitled "Method and Apparatus for Neutral Beam Processing Based on Gas Cluster Ion Beam Technology," the contents of which are incorporated by reference as if fully set forth herein. Advantageously, neutral beam oxidation is a highly selective, directional oxidation process allowing for the selective oxidation of only the horizontal portions of the barrier layer 406.

The oxidized portions 502 of the barrier layer 406 are then removed (selective to the unoxidized (vertical) portions 406a of barrier layer 406, which are now given reference numeral 406a). See FIG. 6. According to an exemplary embodiment, the oxidized portions 502 of the barrier layer 406 are selectively removed using an isotropic wet etching process. By way of example only, TaOxNy dissolves in hydrofluoric acid (HF), and reacts with potassium bifluoride and HF. See, for example, A. Agulyansky, "Potassium fluorotantalate in solid, dissolved and molten conditions," J. Fluorine Chemistry 123, October 2003, pgs. 155-161, the contents of which are incorporated by reference as if fully set forth herein. Dilute HF, for example, can be used to remove oxidized TiN/Ta/Ti selective to TiN/Ta/Ti. A wet etch chemistry such as dilute peroxide can be used to oxidized WN selective to WN. It is noted that the steps up to this point in the process flow are the same for each of the embodiments described herein. Thus, the description of the alternative embodiments provided below will follow from the structure shown in FIG. 6.

Figure 7:
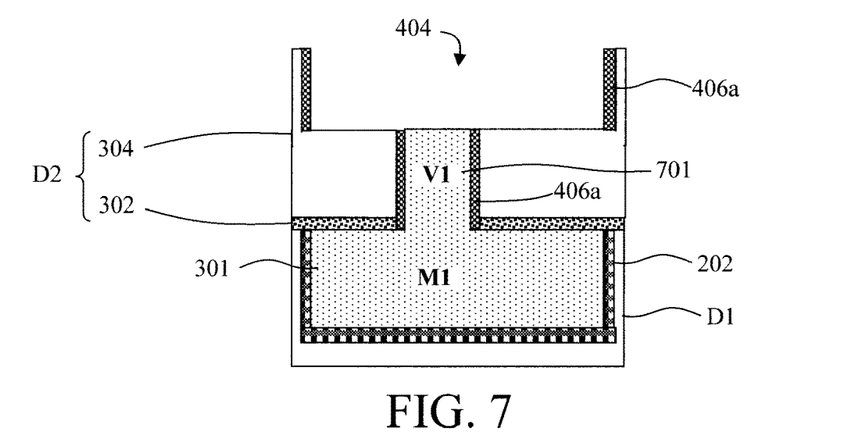
FIG. 7 is a cross-sectional diagram illustrating a conductor having been deposited into (and filling) the via, forming a via V1 according to an embodiment of the present invention.

Next, as shown in FIG. 7, a conductor 701 is then deposited into (and filling) the via 402, forming via V1. According to an exemplary embodiment, the conductor 701 is Cu which is deposited using an electroless plating process. Advantageously, since the barrier layer 406 has been removed from the bottom of the via 402, there is direct Cu-to-Cu contact between the via V1 and the metal line M1. Portions of barrier layer 406a, however, remain lining the sidewalls of the via V1.

Figure 8:
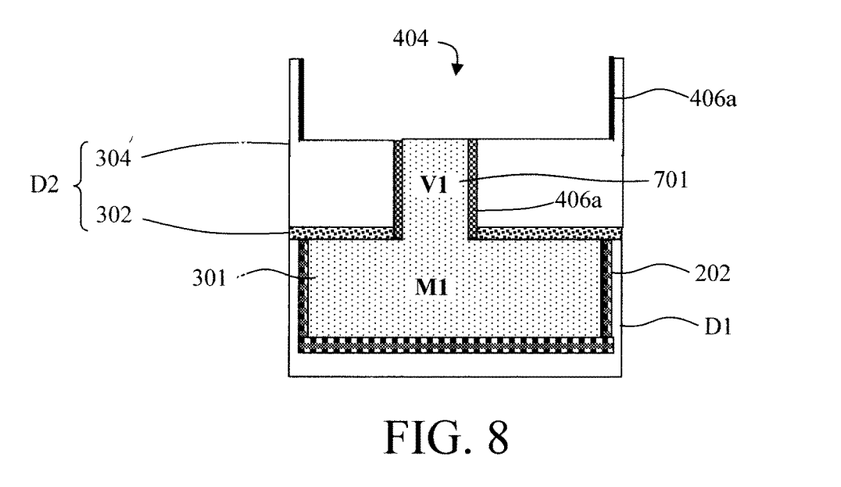
FIG. 8 is a cross-sectional diagram illustrating an etch having been used to at least partially strip the remaining portions of the first barrier layer from the trench according to an embodiment of the present invention.
Figure 9:
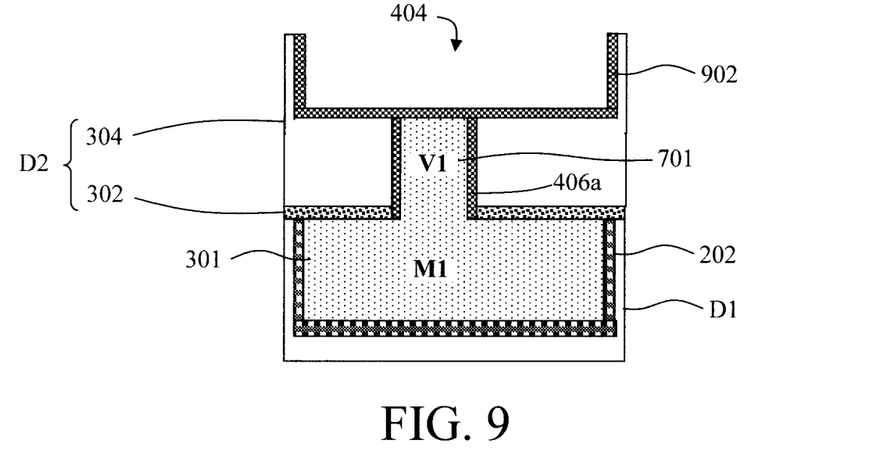
FIG. 9 is a cross-sectional diagram illustrating the trench having been lined with a second barrier layer according to an embodiment of the present invention.
Figure 10:
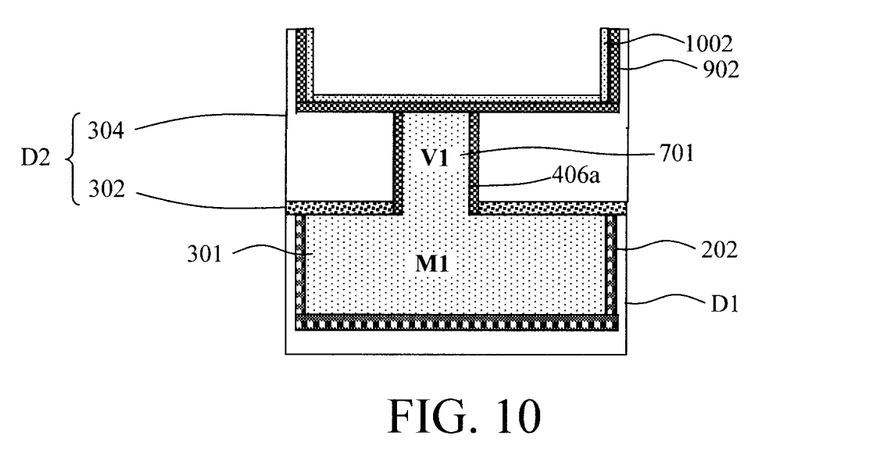
FIG. 10 is a cross-sectional diagram illustrating a seed layer having been deposited into the trench onto the second barrier layer according to an embodiment of the present invention.

In preparation for forming the metal line M2, the barrier layer needs to be added back to the trench 404. To do so, it is preferable to at least partially remove the remaining portions of barrier layer 406a from the trench 404. The reason for this step is that when the barrier layer is added back to the trench 404 it will end up being too thick along the vertical sidewalls of the trench 404 if simply added on top of the existing portions 406a. Thus, as shown in FIG. 8, an etch is used to strip the remaining portions of barrier layer 406a from the trench 404. According to an exemplary embodiment, remaining portions of barrier layer 406a are selectively removed from the trench 404 using a non-directional (isotropic) etching process such as a nitride-selective wet etch in the case of TaN. It is notable that the etch does not need to fully remove the portions of barrier layer 406a as long as they are substantially thinned. For instance, the portions of barrier layer 406a are reduced in thickness by greater than or equal to about 50% of their original thickness. Thus, for example, if the portions of barrier layer 406a have a starting thickness of about 5 nm (see above), then reducing the thickness of portions of barrier layer 406a to about 2.5 nm or less is sufficient.

The trench is then lined with another conformal barrier layer 902 using a process such as CVD, ALD or PVD. See FIG. 9. For clarity, the terms "first" and "second" may be used herein when referring to barrier layers 406 and 902, respectively. As provided above, suitable materials for the barrier layer include, but are not limited to, TaN, TiN, WN, Ta and/or Ti. By way of example only, the same material(s) can be used for barrier layer 902 as barrier layer 406. However, this is not a requirement, and a different material(s) from barrier layer 406 can be employed if so desired. According to an exemplary embodiment, barrier layer 902 has a thickness of from about 2 nm to about 10 nm and ranges therebetween.

A thin, conformal seed layer 1002 is then deposited into the trench 404 onto the barrier layer 902 which will enable, e.g., electroless plating, to be used in forming the metal line M2 in trench 404. See FIG. 10. Suitable materials for the seed layer 1002 include, but are not limited to, Cu. A conformal deposition process such as CVD, ALD or PVD can be employed to deposit the seed layer 1002. According to an exemplary embodiment, the seed layer 1002 has a thickness of from about 5 nm to about 20 nm and ranges therebetween.

Figure 11:
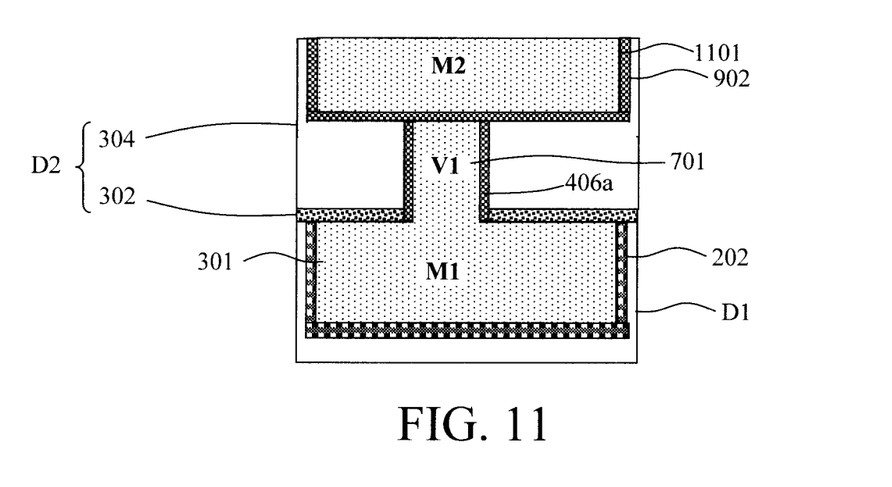
FIG. 11 is a cross-sectional diagram illustrating a conductor (e.g., Cu) having been deposited into (and filling) the trench, forming a metal line M2 according to an embodiment of the present invention.

Next, as shown in FIG. 11, a conductor 1101 is then deposited into (and filling) the trench 404, forming metal line M2. It is notable that, once the M2 metal line is formed, the seed layer 1002 is no longer distinguishable from the conductor 1101, and thus the seed layer 1002 is no longer shown as a distinct layer in the figures. According to an exemplary embodiment, the conductor 1101 is Cu which is deposited using an electroplating or electroless plating process. Advantageously, the barrier layer 902 remains at the top of the via V1 which, as provided above, exhibits blocking boundary effects.

In a variation of this embodiment, another exemplary methodology for forming a Cu interconnect structure in accordance with the present techniques is now described by way of reference to FIGS. 12-16 whereby a different barrier layer material (e.g., manganese silicate (MnSixOy)) is added back to the bottom of the trench 404 such that the sidewalls of the via 402 and trench 404 are lined with one barrier layer material and the bottom of the trench is lined with another, different barrier layer material.

As highlighted above, the initial steps for this alternative embodiment are the same as those described in conjunction with the description of FIGS. 1-6, above. Thus, FIG. 12 follows from the structure depicted in FIG. 6 and described above.

Figure 6:
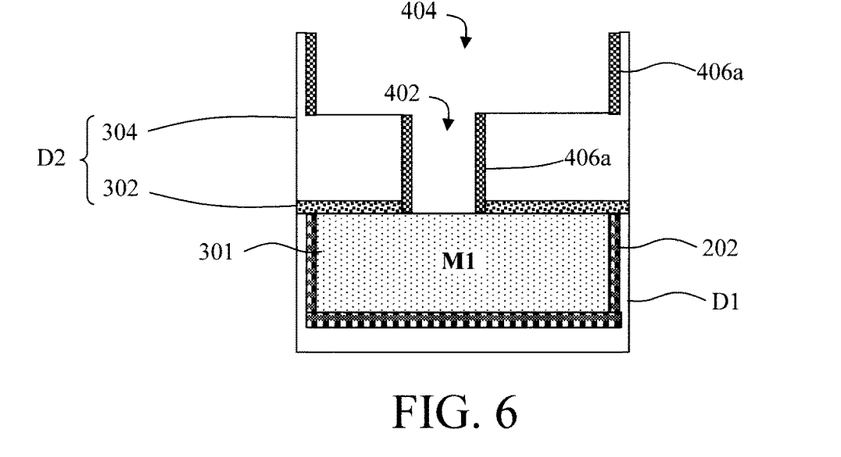
FIG. 6 is a cross-sectional diagram illustrating the oxidized portions of the first barrier layer having been selectively removed according to an embodiment of the present invention.
Figure 12:
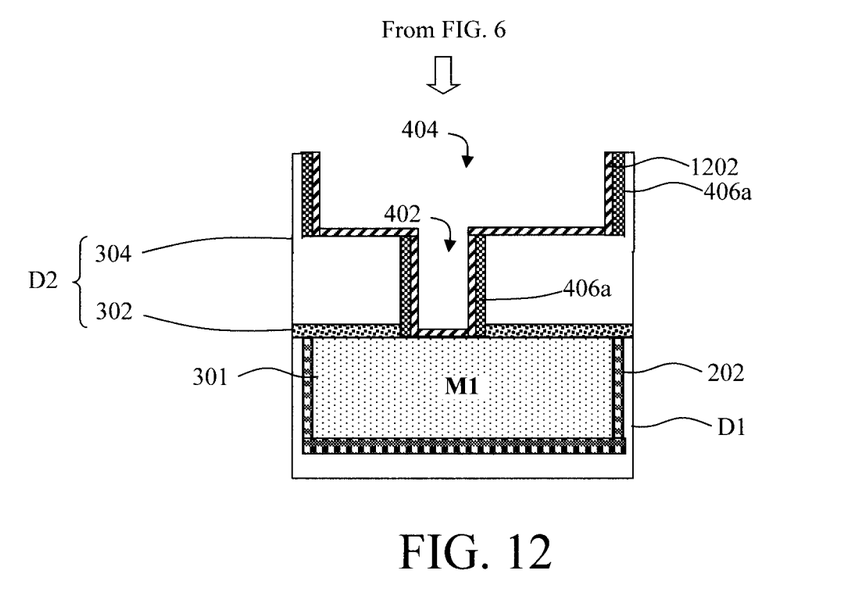
FIG. 12 is a cross-sectional diagram illustrating, according to an alternative embodiment which follows from FIG. 6, a liner (e.g., Mn) having been deposited into/lining the via and trench according to an embodiment of the present invention.
Figure 13:
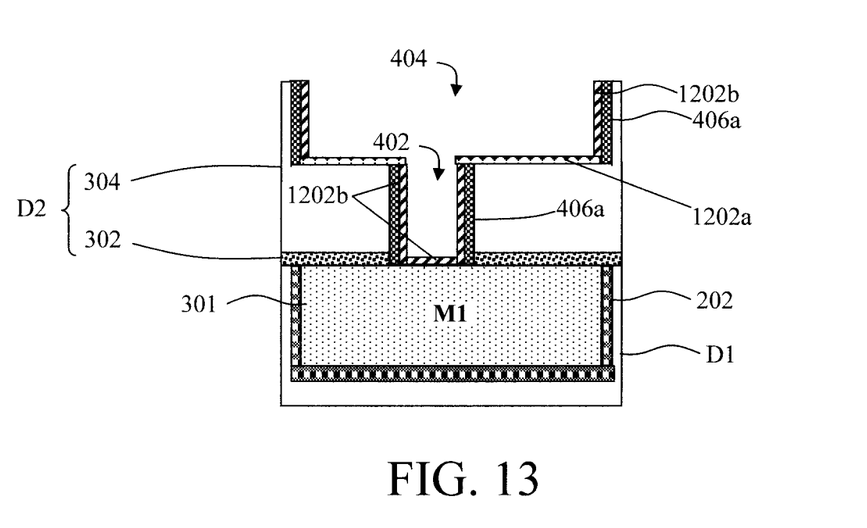
FIG. 13 is a cross-sectional diagram illustrating an anneal of the liner having been performed to react the liner with exposed dielectric forming a second barrier layer (e.g., MnSixOy) at a bottom of the trench according to an embodiment of the present invention.

Following from FIG. 6, as shown in FIG. 12 in this alternative embodiment a conformal liner 1202 is deposited into/lining the via 402 and trench 404. A process such as CVD, ALD or PVD can be used to deposit the liner 1202 into the via 402 and trench 404. According to an exemplary embodiment, the liner 1202 is formed from manganese (Mn) and has a thickness of from about 5 nm to about 20 nm and ranges therebetween. In yet another alternative embodiment (described below), the liner additionally contains Cu enabling it to further serve as a seed layer.

It is notable that, based on the above described process whereby the barrier layer 406 is selectively removed (via neutral beam oxidation) from the horizontal surfaces including the bottom of the via 402 and the bottom of the trench 404, the ILD 304 is now exposed at the bottom of the trench 404. Thus, the liner 1202 is disposed i) directly on the ILD 304 at the bottom of the trench 404 and ii) on the remaining portions of barrier layer 406a along the sidewalls of the via 402 and trench 404.

An anneal of the liner 1202 is then performed to react the liner 1202 with the exposed ILD 304. As provided above, the liner 1202 can be formed from Mn. In that case, portions 1202a of the liner 1202 in contact with the exposed ILD 304 at the bottom of the trench 404 will selectively be converted to MnSixOy, while portions 1202b of the liner 1202 remain unreacted Mn. Notably, the portions 1202b of liner 1202 at the bottom of the via 402 are present directly on the metal line M1 and remain unreacted Mn. See FIG. 13. According to an exemplary embodiment, the anneal is performed at a temperature of from about 100° C. to about 400° C. and ranges therebetween, for a duration of from about 30 minutes to about 120 minutes and ranges therebetween.

Figure 14:
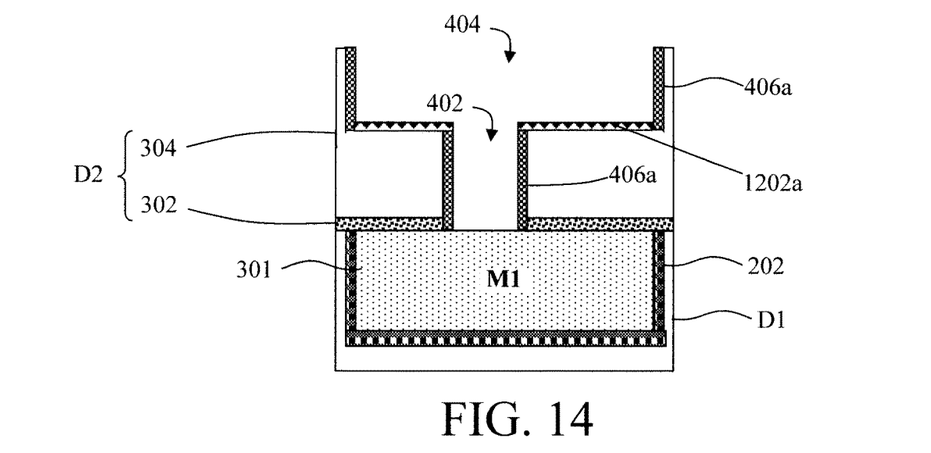
FIG. 14 is a cross-sectional diagram illustrating unreacted portions of the liner having been removed selective to the reacted portions of the liner according to an embodiment of the present invention.

The unreacted portions 1202b of the liner 1202 are then removed selective to the reacted portions 1202a of the liner 1202. See FIG. 14. As shown in FIG. 14, what remains are the reacted portions 1202a of the liner 1202 (e.g., MnSixOy) disposed on the ILD 304 at the bottom of the trench 404. According to an exemplary embodiment, the unreacted portions 1202b of the liner 1202 are selectively removed using deionized (DI) water. The reacted portions 1202a of the liner 1202 (e.g., MnSixOy) will serve as a barrier layer at the bottom of the trench 404. Thus, for clarity, the terms "first barrier layer" and "second barrier layer" may be used herein when referring to barrier layer 406 and portions 1202a of the liner 1202 (e.g., MnSixOy), respectively.

Figure 15:
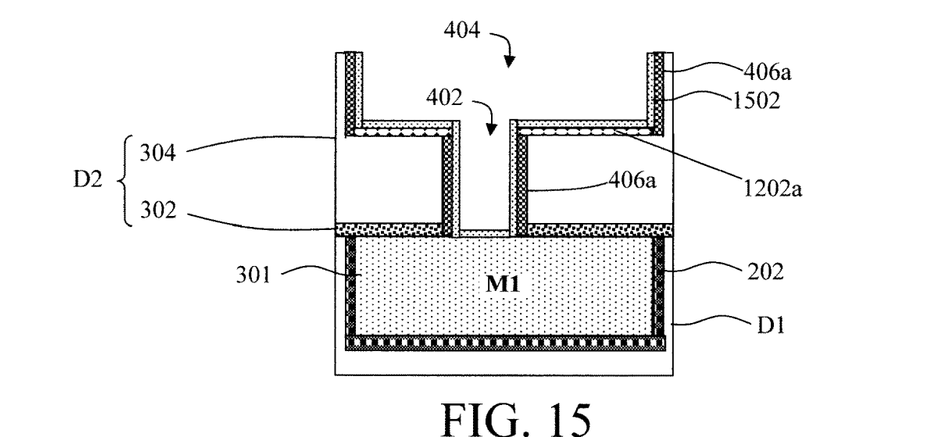
FIG. 15 is a cross-sectional diagram illustrating a seed layer having been deposited into the via and trench according to an embodiment of the present invention.

A thin, conformal seed layer 1502 is then deposited into the via 402 and trench 404 which will enable, e.g., electroless plating, to be used in forming the metal line M2 in trench 404. See FIG. 15. As shown in FIG. 15, the seed layer 1502 is present on the portions of barrier layer 406a along the sidewalls of the via 402 and trench 404, on the reacted portions 1202a of the liner 1202 (e.g., MnSixOy) at the bottom of the trench 404 and on the metal line M1 at the bottom of the via 402.

As provided above, suitable materials for the seed layer 1502 include, but are not limited to, Cu. A conformal deposition process such as CVD, ALD or PVD can be employed to deposit the seed layer 1502. According to an exemplary embodiment, the seed layer 1502 has a thickness of from about 5 nm to about 20 nm and ranges therebetween.

Figure 16:
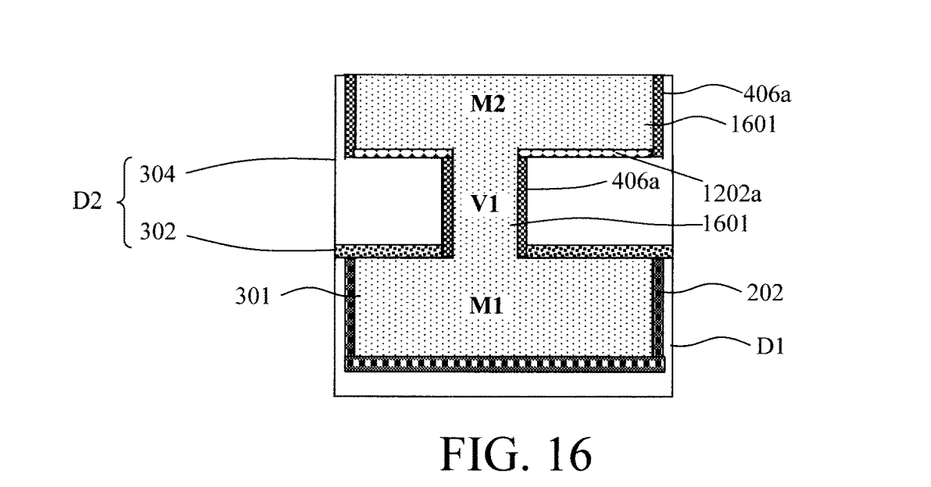
FIG. 16 is a cross-sectional diagram illustrating a conductor (e.g., Cu) having been deposited into (and filling) the via and trench, forming a via V1 and a metal line M2 according to an embodiment of the present invention.

Next, as shown in FIG. 16, a conductor 1601 is then deposited into (and filling) the via 402 and trench 404, forming via V1 and metal line M2, respectively. It is notable that, once the via V1 and M2 metal line are formed, the seed layer 1502 is no longer distinguishable from the conductor 1601, and thus the seed layer 1502 is no longer shown as a distinct layer in the figures. According to an exemplary embodiment, the conductor 1601 is Cu which is deposited using an electroless plating process.

As highlighted above, a variant of this process involves employing a liner that also serves as a seed layer, eliminating the additional step of depositing a separate seed layer prior to plating. This alternative exemplary methodology for forming a Cu interconnect structure in accordance with the present techniques is now described by way of reference to FIGS. 17-19. As highlighted above, the initial steps for this alternative embodiment are the same as those described in conjunction with the description of FIGS. 1-6, above. Thus, FIG. 17 follows from the structure depicted in FIG. 6 and described above.

Figure 17:
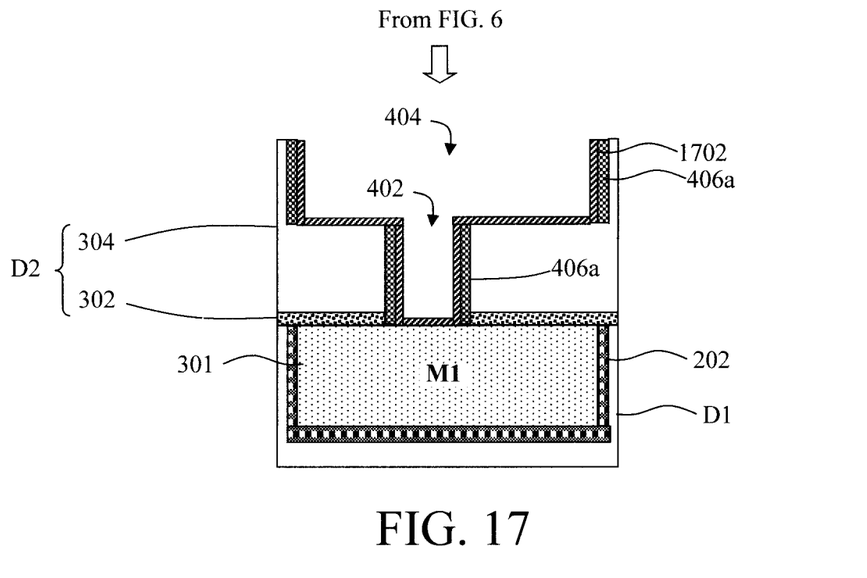
FIG. 17 is a cross-sectional diagram illustrating, according to an alternative embodiment which follows from FIG. 6, a conformal liner and seed layer (e.g., CuMn) having been deposited into/lining the via and trench according to an embodiment of the present invention.

Following from FIG. 6, as shown in FIG. 17 in this alternative embodiment a conformal liner 1702 is deposited into/lining the via 402 and trench 404. A process such as CVD, ALD or PVD can be used to deposit the liner 1702 into the via 402 and trench 404. According to an exemplary embodiment, the liner 1702 is formed from Cu—Mn alloy and has a thickness of from about 5 nm to about 20 nm and ranges therebetween.

Figure 18:
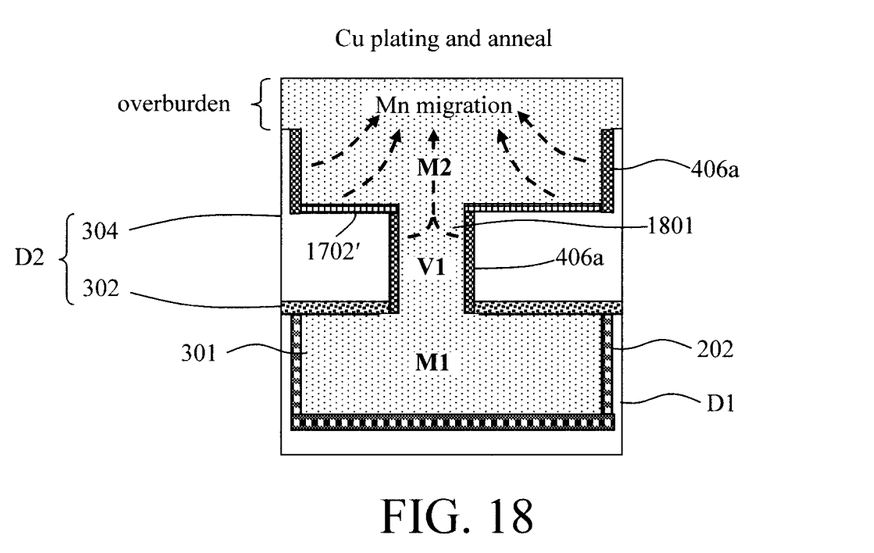
FIG. 18 is a cross-sectional diagram illustrating a conductor (e.g., Cu) having been deposited into (and filling) the via and trench, forming a via V1 and a metal line M2, and an anneal of the liner/conductor having been performed to react the liner with the exposed dielectric forming a second barrier layer (e.g., MnSixOy) at a bottom of the trench according to an embodiment of the present invention.

With the liner 1702 in place and serving as a seed layer, as shown in FIG. 18, a conductor 1801 is then deposited into (and filling) the via 402 and trench 404, forming via V1 and metal line M2, respectively. According to an exemplary embodiment, the conductor 1801 is Cu which is deposited using an electroless plating process.

Following Cu plating, an anneal of the liner 1702/conductor 1801 is then performed to react the liner 1702 with the exposed ILD 304. As provided above, the liner 1702 can contain Mn. In that case, (reacted) portions 1702' of the liner 1702 in contact with the exposed ILD 304 at the bottom of the trench 404 will selectively be converted to MnSixOy. The reacted portions 1702' of the liner 1702 (e.g., MnSixOy) will serve as a barrier layer at the bottom of the trench 404. Thus, for clarity, the terms "first barrier layer" and "second barrier layer" may be used herein when referring to barrier layer 406 and portions 1702' of the liner 1702 (e.g., MnSixOy), respectively.

According to an exemplary embodiment, the anneal is performed at a temperature of from about 100° C. to about 400° C. and ranges therebetween, for a duration of from about 30 minutes to about 120 minutes and ranges therebetween. Notably, the unreacted (e.g., Mn) liner 1702 (i.e., those portions of the liner 1702 disposed on the portions 406a of the barrier layer along the sidewalls of the via 402 and trench 404 and on the metal line M1 at the bottom of the via 402) migrate, via the anneal, through the conductor 1801 to the overburden at the top of the structure, and will be removed via CMP—see below. See FIG. 18. Thus, only the reacted portions 1702' of the liner 1702 remain visible in the figures.

Figure 19:
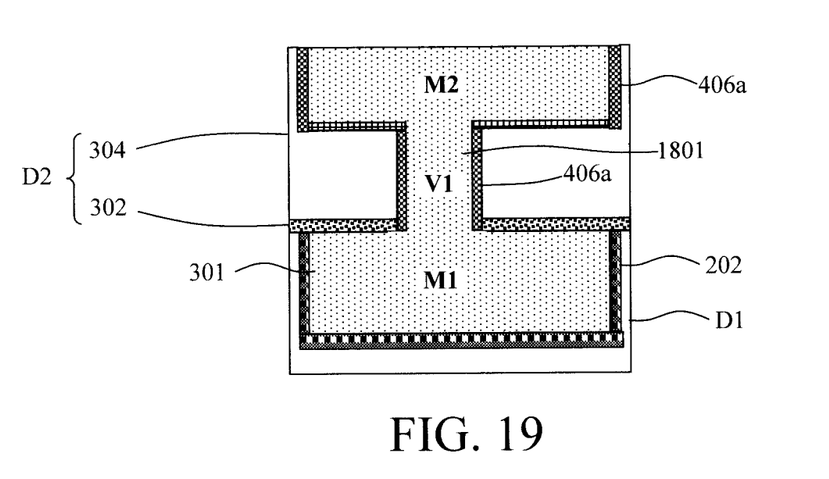
FIG. 19 is a cross-sectional diagram illustrating the Cu overburden having been removed according to an embodiment of the present invention.

As shown in FIG. 19, the overburden is then removed. According to an exemplary embodiment, the overburden is removed using a process such as chemical-mechanical polishing (CMP) to polish the conductor 1801.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method for forming a copper (Cu) interconnect structure, the method comprising the steps of:
    forming a via and a trench in a dielectric over a metal line M1;
    depositing a first barrier layer into, and lining, the via and the trench;
    removing the first barrier layer from a bottom of the via and a bottom of the trench by selectively oxidizing portions of the first barrier layer along the bottom of the via and the bottom of the trench using neutral beam oxidation that does not damage the dielectric, and removing the portions of the first barrier layer that have been oxidized including at the bottom of the via such that the first barrier layer remains along only sidewalls of the via and the trench;
    depositing Cu into the via in direct contact with the metal line M1 to form a via V1;
    at least partially removing the first barrier layer that remains along the sidewalls of the trench;
    lining the trench with a second barrier layer that covers a top of the via V1; and
    depositing Cu into the trench over the second barrier layer to form a metal line M2.

2. The method of claim 1, wherein the first barrier layer and the second barrier layer each comprises a material selected from the group consisting of: tantalum nitride (TaN), titanium nitride (TiN), tungsten nitride (WN), titanium (Ti), tantalum (Ta) and combinations thereof.

3. The method of claim 2, wherein the first barrier layer comprises a same material as the second barrier layer.

4. The method of claim 1, wherein the Cu is deposited into the trench using an electroless Cu plating, the method further comprising the step of:
    depositing a Cu seed layer onto the second barrier layer in the trench.

5. The method of claim 1, wherein the dielectric comprises:
    a capping layer on the metal line M1; and
    an interlayer dielectric on the capping layer.

6. The method of claim 5, wherein the capping layer comprises a material selected from the group consisting of: silicon carbon nitride (SiCN), hydrogen silicon carbon nitride (SiCNH), aluminum nitride (AlN) and combinations thereof.

7. The method of claim 5, wherein the capping layer comprises an ultralow-κ dielectric having a dielectric constant κ of less than 2.7.

\* \* \* \* \*